US012673363B2

(12) United States Patent
Liao et al.

(10) Patent No.: US 12,673,363 B2
(45) Date of Patent: Jul. 7, 2026

(54) ALLOY MICROSTRUCTURE FORMATION FOR CHAMBER COMPONENTS

(71) Applicant: APPLIED MATERIALS, INC., Santa Clara, CA (US)

(72) Inventors: Chien-Min Liao, Santa Clara, CA (US); Chao C. Liu, San Jose, CA (US); Tom Cho, Los Altos, CA (US); Hyeon Geu Kim, Santa Clara, CA (US); Hari Ponnekanti, San Jose, CA (US); Jay Merkel, Los Gatos, CA (US); Bruce Alger, San Jose, CA (US); Sathish Babu Janjam, Santa Clara, CA (US); Cheng-Hsuan Chou, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 9 days.

(21) Appl. No.: 18/422,570

(22) Filed: Jan. 25, 2024

(65) Prior Publication Data

US 2025/0242406 A1      Jul. 31, 2025

(51) Int. Cl.
*C23C 16/40*          (2006.01)
*B22F 1/16*          (2022.01)
          (Continued)

(52) U.S. Cl.
CPC .............. *B22F 1/16* (2022.01); *C23C 16/403* (2013.01); *C23C 16/45525* (2013.01);
          (Continued)

(58) Field of Classification Search
CPC ... B32B 15/016; B32B 15/16; C23C 16/4404; C23C 16/403
See application file for complete search history.

(56) References Cited

U.S. PATENT DOCUMENTS

| | | | |
|---|---|---|---|
| 5,407,863 A | * | 4/1995 | Katsura ............. H01L 21/32051 |
| | | | 257/E21.295 |
| 6,120,640 A | | 9/2000 | Shih et al. |

(Continued)

FOREIGN PATENT DOCUMENTS

| | | |
|---|---|---|
| WO | 2018005376 A1 | 1/2018 |
| WO | 2020098065 A1 | 5/2020 |

(Continued)

OTHER PUBLICATIONS

Torbati-Sarral et al., "A Comparative Study of Corrosion Behavior of an Additively Manufactured AI-6061 RAM2 with extruded AI-6061 T6", Elsevier, vol. 174, Sep. 2020, 27 pages.

(Continued)

*Primary Examiner* — Adam Krupicka
(74) *Attorney, Agent, or Firm* — Lowenstein Sandler LLP

(57) ABSTRACT
Described herein is a chamber component having a body comprising a plurality of aluminum alloy compositions. A first portion of the body includes a first aluminum alloy composition having a first grain size, and a second portion of the body includes a second aluminum alloy composition having a second grain size, wherein the first grain size of the first aluminum alloy composition is greater than the second grain size of the second aluminum alloy composition. A method for preparing the chamber component is also provided.

16 Claims, 4 Drawing Sheets

300

315

310

305

(51) Int. Cl.

| | |
|---|---|
| *B33Y 10/00* | (2015.01) |
| *B33Y 80/00* | (2015.01) |
| *C23C 16/455* | (2006.01) |
| *B32B 15/01* | (2006.01) |

(52) U.S. Cl.
CPC ..... *B22F 2301/052* (2013.01); *B22F 2304/10* (2013.01); *B32B 15/016* (2013.01); *B33Y 10/00* (2014.12); *B33Y 80/00* (2014.12)

(56) References Cited

U.S. PATENT DOCUMENTS

| | | | |
|---|---|---|---|
| 2006/0159940 | A1 | 7/2006 | Bhatnagar et al. |
| 2012/0135155 | A1 | 5/2012 | Han et al. |
| 2014/0272459 | A1 | 9/2014 | Daugherty et al. |
| 2018/0340254 | A1 | 11/2018 | Polcik et al. |
| 2020/0024700 | A1 | 1/2020 | Martin et al. |

FOREIGN PATENT DOCUMENTS

| | | |
|---|---|---|
| WO | 2021262508 A1 | 12/2021 |
| WO | 2022159278 A1 | 7/2022 |

OTHER PUBLICATIONS

Kan et al., A Critical Review on the Effects of Process-Induced Porosity on the Mechanical Properties of Alloys Fabricated by Laser Powder Bed Fusion, Elsevier, 1 page.

International Search Report and Written Opinion for International Application No. PCT/US2025/012465, mailed May 13, 2025, 10 Pages.

International Search Report and Written Opinion for International Application No. PCT/US2024/047518, mailed Dec. 19, 2024, 13 Pages.

* cited by examiner

200
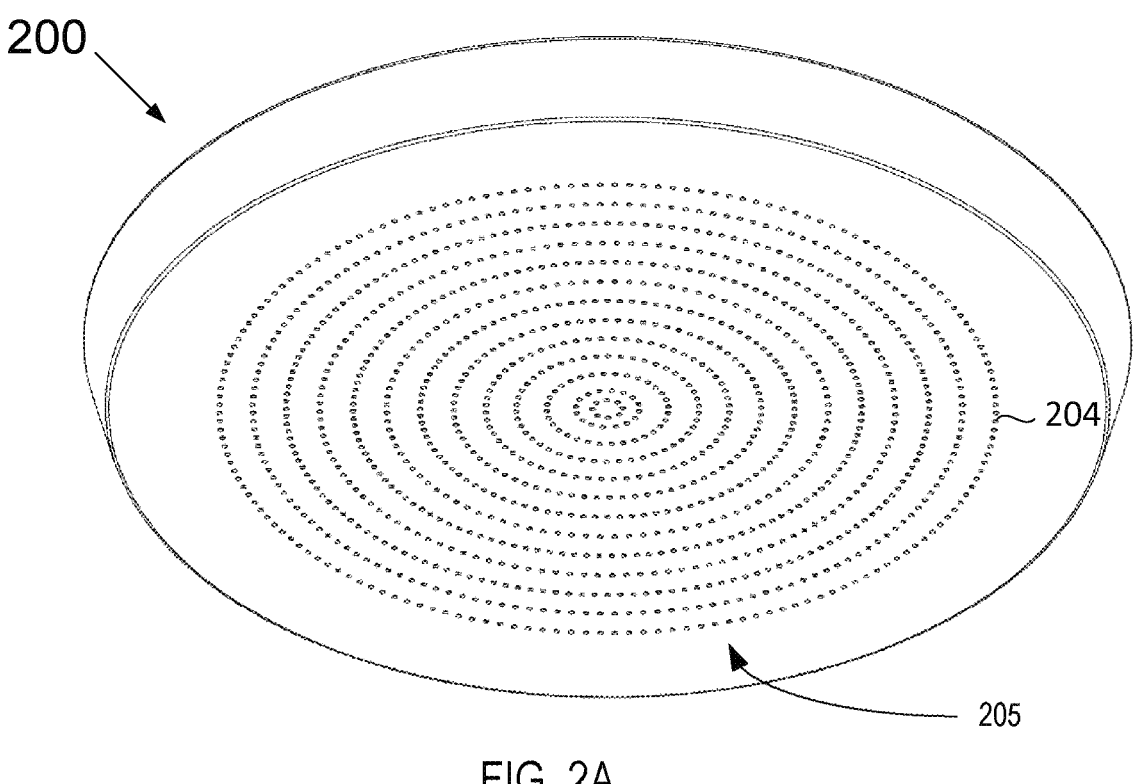
204
205
FIG. 2A
220
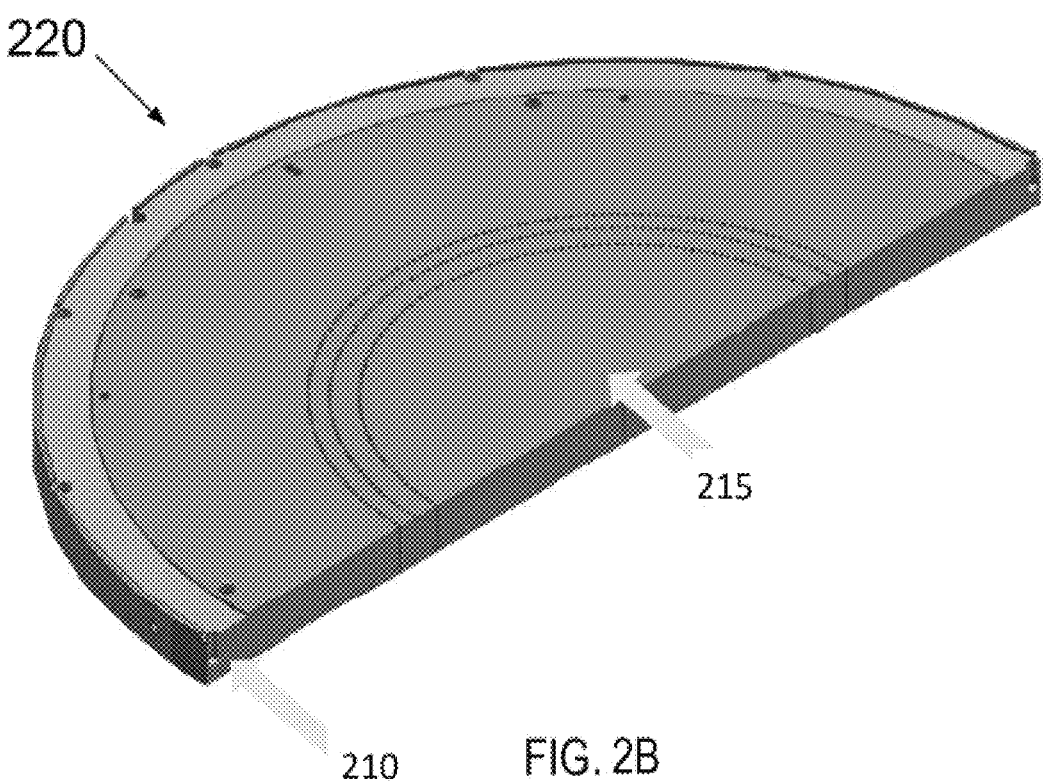
215
210    FIG. 2B

300

315

310

305

400

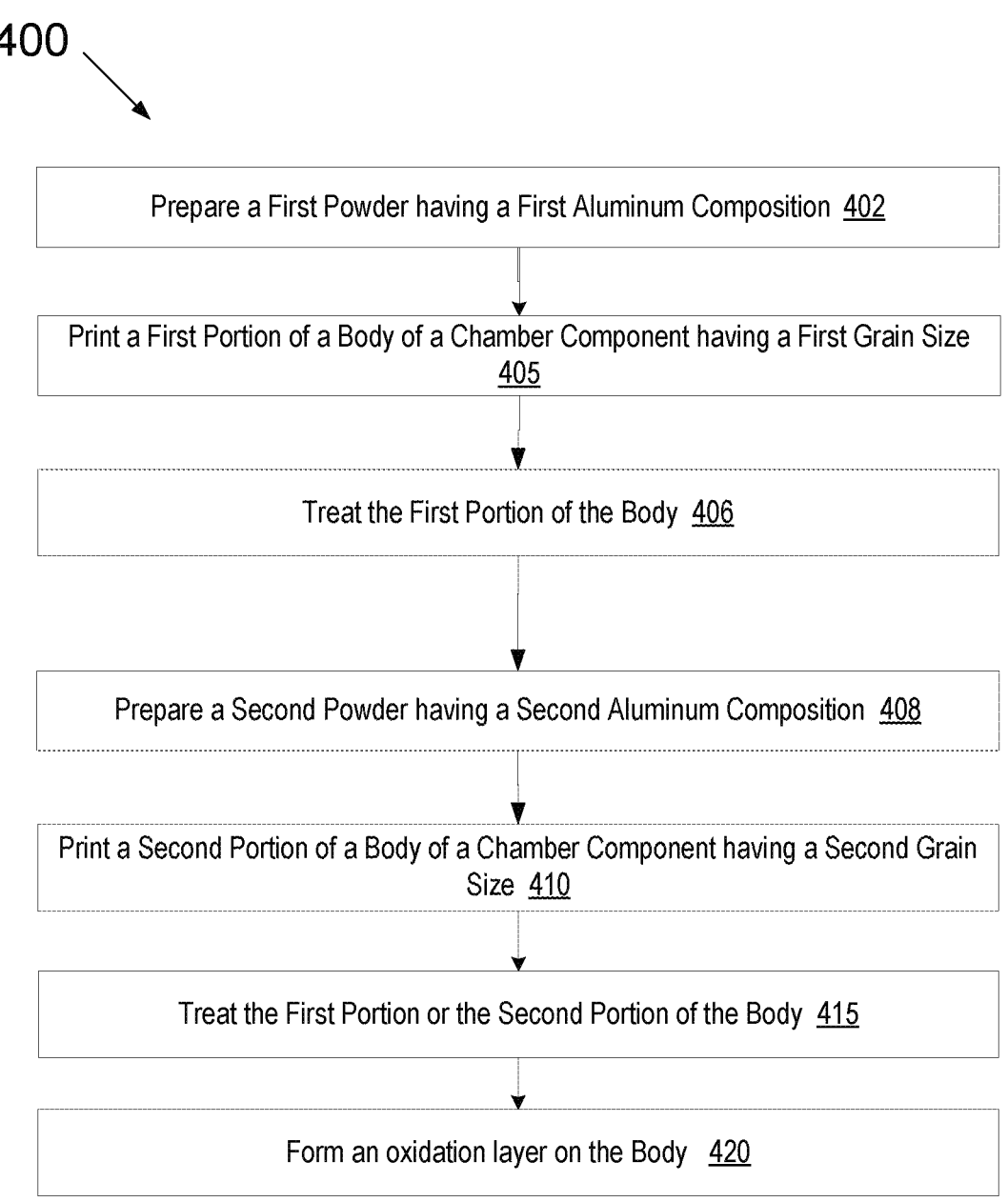

Prepare a First Powder having a First Aluminum Composition  402

Print a First Portion of a Body of a Chamber Component having a First Grain Size  405

Treat the First Portion of the Body  406

Prepare a Second Powder having a Second Aluminum Composition  408

Print a Second Portion of a Body of a Chamber Component having a Second Grain Size  410

Treat the First Portion or the Second Portion of the Body  415

Form an oxidation layer on the Body  420

FIG. 4

ALLOY MICROSTRUCTURE FORMATION FOR CHAMBER COMPONENTS

TECHNICAL FIELD

Embodiments of the present disclosure relate, in general, to a chamber component including layers of aluminum alloy compositions having improved corrosion resistance. In particular, embodiments relate to methods for producing chamber components including using a three dimensional printer and/or an atomic layer deposition process.

BACKGROUND

Various manufacturing processes expose semiconductor process chamber components to high temperatures, high energy plasma, a mixture of corrosive gases, high stress, and combinations thereof. These extreme conditions may erode and/or corrode the chamber components, or may form particles/deposits on the surface of the chamber components. For example, the particles/deposits may accumulate on a chamber component causing particles and metal contamination on wafers. These deposits may increase the chamber components' susceptibility to defects and/or may impact yield. The extreme conditions may further cause flaking and/or film cracking on a chamber component, such as a wafer. It may be advantageous to prevent and/or to remove the particles/deposits to extend the lifespan of the chamber component.

Currently, a metal alloy, such as an aluminum alloy, is frequently used in the formation of chamber components. Because of the extreme conditions of the process chamber, the metal alloy may be subject to corrosion and/or erosion.

SUMMARY

Disclosed herein is a chamber component including an aluminum alloy having improved corrosion resistance, wherein the grain size and/or microstructure of the aluminum alloy composition is controlled. The grain size and/or microstructure of the aluminum alloy composition may be selectively controlled to improve the corrosion resistance during three dimensional printing and/or an atomic layer deposition process.

In some embodiments of the present disclosure, a chamber component including a body may include a plurality of aluminum alloy compositions. The body may include a first portion of the body including a first aluminum alloy composition having a first grain size, and a second portion of the body including a second aluminum alloy composition having a second grain size. The first grain size of the first aluminum alloy composition may be greater than the second grain size of the second aluminum alloy composition.

In some embodiments of the present disclosure, a method is provided. The method may include printing a first portion of a chamber component for a process chamber using a three dimensional printer, wherein the first portion of the chamber component may include a first aluminum alloy composition having a first grain size. The method may further include printing a second portion of the chamber component using the three dimensional printer, wherein the second portion of the chamber component includes a second aluminum alloy composition having a second grain size. The first grain size of the first aluminum alloy composition may be greater than the grain size of the second aluminum alloy composition.

In some embodiments, an additional method is provided. The method includes providing an atomic layer deposition process to form an oxidation layer on a surface of a substrate. Performing the atomic layer deposition process may include depositing at least one layer including aluminum oxide. The substrate may include an aluminum alloy composition comprising aluminum, magnesium, titanium, and at least one of boron (B), carbon (C), magnesium (Mg), titanium (Ti), nickel (Ni), manganese (Mn), chromium (Cr), iron (Fe), silicon (Si), zinc (Zn), tin (Sn), lead (Pb), nitrogen (N), oxygen (O), zirconium (Zr), lithium (Li), bismuth (Bi), fluorine (F), yttrium (Y), lanthanum (La), scandium (Sc), cerium (Ce), neodymium (Nd), gadolinium (Gd), ytterbium (Yb), or a combination thereof, and the aluminum alloy composition may have a grain size of about 0.5 nm to about 100 μm.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2A depicts a bottom view of a showerhead.

FIG. 2B depicts a top view of a showerhead in accordance with an embodiment of the present disclosure.

FIG. 4 is a flow chart representing a method for producing a chamber component according to an embodiment of the present disclosure.

DETAILED DESCRIPTION

Figure 1:
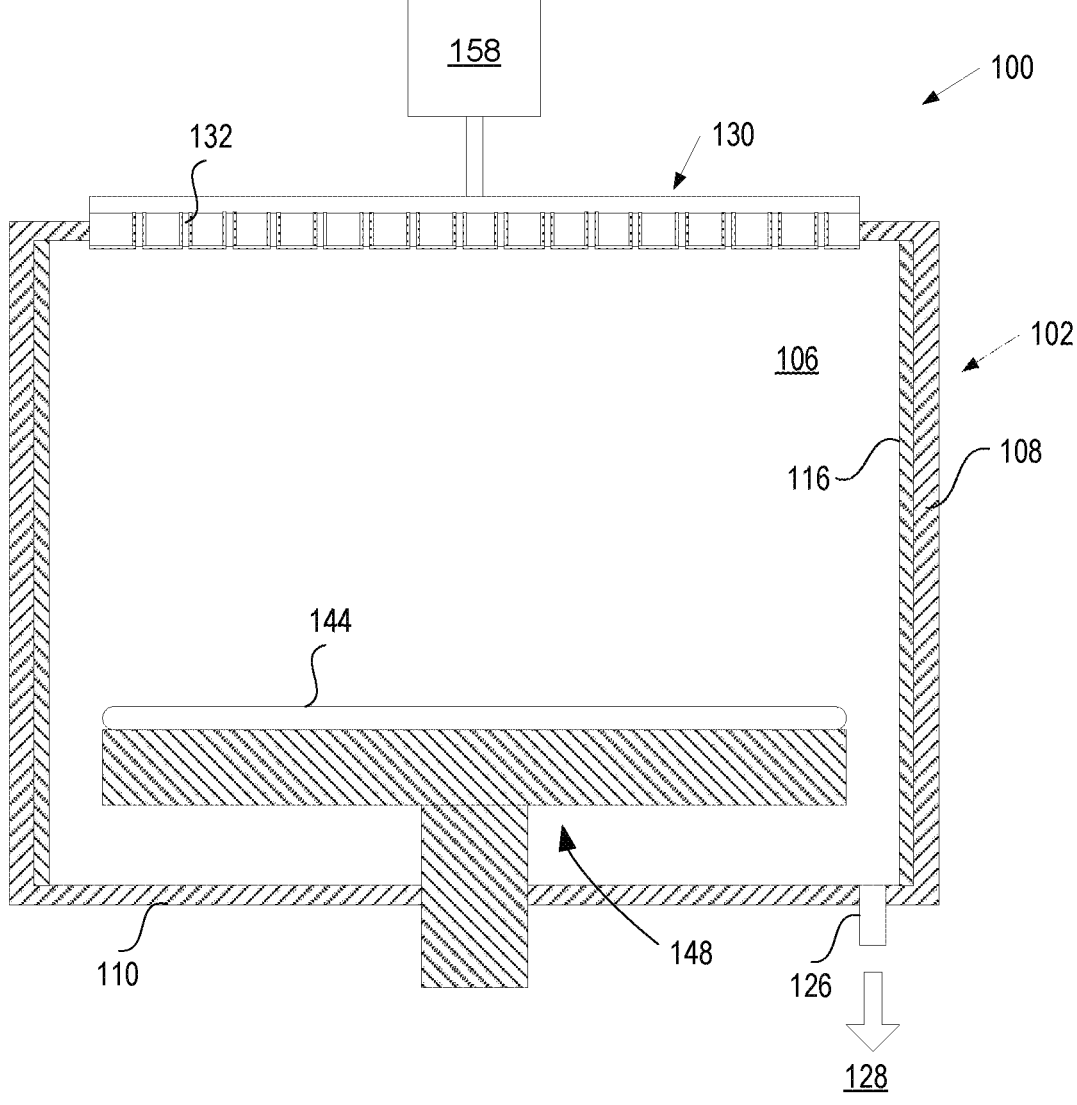
FIG. 1 depicts a cross sectional view of a processing chamber.

Chamber components are used in a variety of ways during the manufacturing process of a semiconductor device. During manufacturing of a device, a chamber component in a chamber used to perform one or more processes for manufacturing of the device may be subject to a variety of conditions including exposure to a plasma, corrosive gases and/or high temperatures. Over time, exposure to such conditions can cause the chamber component to corrode and/or erode, such that the performance of the chamber component is impacted and it is replaced, or maintenance may need to be performed. For example, material properties of a chamber component may change over time because of reactions with a plasma, or corrosive gas, such as chlorine. The present disclosure includes various alloy compositions (e.g., aluminum alloy compositions) for a chamber component that are corrosion resistant and thus expand the lifespan of the chamber component. The aluminum alloy compositions described in embodiments are 3D printable and have improved corrosion resistance as compared to traditional aluminum alloys such as Al 6061 because of the size and architecture of the alloy.

Embodiments described herein are directed to new and useful aluminum alloy compositions that can be tailored for specific uses with respect to device processing (e.g., semiconductor processing). Aluminum alloy compositions may be adjusted in embodiments to improve corrosion resistance, adjust material strength, adjust hardness, adjust thermal conductivity, adjust impedance, adjust coefficient of thermal expansion, and/or other properties. In embodiments, powders are prepared that are either composed of the aluminum alloy composition or that, when used to perform 3D printing of a part using the powders, result in a 3D printed part having the aluminum alloy composition.

In embodiments, material surface properties of chamber components may be tailored by tailoring the grain size of aluminum alloy composition of the chamber components. Material surface properties may be considered, such as functional requirements associated with part geometries. For example, it has been found that the density of magnesium, and the method of forming the alloy with magnesium can effect the corrosion resistance.

In some embodiments, multiple different aluminum alloy compositions may be used in 3D printing of chamber components and/or other parts. For example, a first aluminum alloy composition may be used to print one or more first portions of a chamber component and a second aluminum alloy composition may be used to print one or more second portions of the chamber component. A material source may be changed during the printing process to cause the first portions to have the first aluminum alloy composition and the second portions to have the second aluminum alloy composition. Alternatively, the grain size of the aluminum alloy composition may be varied using a post-treatment process to improve the corrosion resistance. In one example, a surface of the chamber component that will be exposed to a plasma (e.g., a fluorine-based plasma) may have an aluminum alloy composition that has an increased corrosion resistance and a remainder of the chamber component that will not be exposed to the plasma (e.g., an interior of the chamber component) may have a different aluminum alloy composition that is less resistant to corrosion but that has other beneficial properties, such as being less expensive, having greater material strength, and so on. This enables multiple material properties to be combined into a single part or unit. For example, the single part may have some regions that include an aluminum alloy composition that has a first corrosion resistance, a first thermal conductivity, a first impedance, a first coefficient of thermal expansion (CTE), and so on and some regions that include a different aluminum alloy composition that has a second corrosion resistance, a second thermal conductivity, a second impedance, a second coefficient of thermal expansion (CTE), and so on. Still other regions may include a third, fourth, fifth, etc. aluminum alloy composition that has a different corrosion resistance, a different thermal conductivity, a different impedance, a different coefficient of thermal expansion (CTE), and so on. The single part or unit may not be assembled from sub-parts and may instead be printed as a single part but using different materials during 3D printing of the single part. This may result in the single part having different aluminum alloy compositions and different material properties at different regions. In some embodiments, the chamber component may be made of the same aluminum alloy composition, but the material properties of the aluminum alloy composition may be changed during the printing process through a post-treatment process. Accordingly, material properties may be adjusted regionally over a chamber component or other part to suit applications of the chamber component.

Embodiments enable corrosion resistance and/or other target properties (e.g., such as material strength, Young's Modulus, yield strength, tensile strength, compressive strength, shear strength, fatigue strength, toughness, hardness, ductility, electrical conductivity, electrical resistivity, dielectric constant, dielectric strength, permeability, magnetoresistance, Hall coefficient, Seebeck coefficient, thermal conductivity, thermal resistivity, CTE, specific heat capacity, and so on) to be achieved for an aluminum alloy based on one or more of composition, grain size, and a formation process of the aluminum alloy materials. An aluminum alloy and material properties such as grain size and formation process may be controlled based on a type of component being manufactured and/or an application for the component.

Embodiments provide for techniques to prepare a material source (e.g., powders) for use in 3D printing of parts such as chamber components. Embodiments additionally provide for methods of 3D printing parts such as chamber components that integrate different alloy compositions (e.g., different aluminum alloy compositions) in different regions and thus that have different material properties in different regions.

Embodiments disclosed herein cover various new aluminum compositions that have material properties that are beneficial for certain applications, such as for use in chamber components that will be exposed to plasma. Such aluminum compositions may have improved corrosion resistance and/or plasma resistance as compared to traditional aluminum alloys such as Al 6061.

Embodiments described herein include a chamber component. The chamber component includes a body including a plurality of aluminum alloy compositions, wherein a first portion of the body includes a first aluminum alloy composition having a first grain size of about 1 μm to about 100 μm. The chamber component further includes a second portion of the body includes a second aluminum alloy composition having a second grain size of about 0.1 μm to about 20 μm The first grain size of the first aluminum alloy composition is greater than the second grain size of the second aluminum alloy composition. The grain size described herein refers to a particle size distribution D90 as understood by one of skill in the art.

The chamber component may further include an oxidation layer on the surface of the chamber component. The oxidation layer may include aluminum and magnesium in combination with at least one of boron (B), carbon (C), titanium (Ti), or a combination thereof. In an embodiment, the oxidation layer includes aluminum, magnesium, boron and carbon. In another embodiment, the oxidation layer includes aluminum, magnesium, and titanium. In some embodiments, the oxidation layer is magnesium rich. As understood herein, "magnesium rich" refers to about 0.5 to about 5 wt %, based on total weight of the oxidation layer. It has been found that when the oxidation layer is magnesium rich near the surface, adhesion to anodization is improved when the distribution of elements is homogeneous and either no segregated features or minimal segregated features are formed. It has been found that when the oxidation layer is magnesium rich, the oxidation layer would have selective adhesion to anodization.

In some embodiments, the aluminum alloy composition may include aluminum (Al), wherein the Al may be included in an amount of about 85 wt % to about 99 wt %, based on total weight of the alloy composition. The alloy composition may further include magnesium (Mg), wherein the Mg may be included in an amount of about 1 wt % to about 5 wt %, based on total weight of the alloy composition. The aluminum alloy composition may include one or more additional chemical elements including at least one of B, C, Ti, zirconium (Zr), scandium (Sc), yttrium (Y), or a combination thereof. In some embodiments, the one or more additional chemical elements may form an equiaxed grain structure of an aluminum matrix of the aluminum alloy composition. In some embodiments, the one or more additional chemical elements may include B, C, and Ti. In another embodiment, the one or more additional chemical elements may include Zr, Sc, Y, or a combination thereof.

In some embodiments, the Al may be included in an amount of about 85 wt %, about 88 wt %, about 90 wt %, about 91 wt %, about 92 wt %, about 93 wt %, about 94 wt %, about 95 wt %, about 96 wt %, about 97 wt %, about 98 wt %, about 99 wt %, or any value or sub-range herein, based on total weight of the aluminum alloy composition.

In some embodiments, the Mg may be included in an amount of about 1 wt %, about 1.5 wt %, about 2 wt %, about 2.5 wt %, about 3 wt %, about 3.5 wt %, about 4 wt %, about 4.5 wt %, about 5 wt %, or any value or sub-range herein, based on total weight of the aluminum alloy composition. When including Mg in the alloy composition of the present disclosure, Mg has been found to modulate anodized film porosity and homogeneity of the aluminum alloy composition.

In an embodiment, the aluminum alloy composition may include B. B may be included in an amount of about 0.1 wt % to about 3 wt %, based on total weight of the aluminum alloy composition. In some embodiments, B may be included in an amount of about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, about 1.2 wt %, about 1.4 wt %, about 1.6 wt %, about 1.8 wt %, about 2 wt %, about 2.2 wt %, about 2.4 w %, about 2.6 wt %, about 2.8 wt %, about 3 wt %, or any value or sub-range herein, based on total weight of the aluminum alloy composition.

In an embodiment, the aluminum alloy composition may include C. C may be included in an embodiment of about 0.05 wt % to about 1 wt %, based on total weight of the aluminum alloy composition. In some embodiments, C may be included in an amount of about 0.05 wt %, about 0.08 wt %, about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, or any value or sub-range herein, based on total weight of the aluminum alloy composition.

In an embodiment, the aluminum alloy composition may include Ti. Ti may be included in an amount of about 1 wt % to about 5 wt %, based on total weight of the aluminum alloy composition. In some embodiments, Ti may be included in an amount of about 1 wt %, about 1.5 wt %, about 2 wt %, about 2.5 wt %, about 3 wt %, about 3.5 wt %, about 4 wt %, about 4.5 wt %, about 5 wt %, or any value or sub-range herein, based on total weight of the aluminum alloy composition. Ti may be included in the alloy composition as a grain refiner. In some embodiments, Ti and B may be included in the aluminum alloy composition to enhance the grain refining effect of the aluminum alloy composition, by adding $TiB_2$ to the aluminum alloy composition.

In an embodiment, the aluminum alloy composition may further include at least one additional element. The at least one additional element may include at least one of nickel (Ni), manganese (Mn), chromium (Cr), iron (Fe), silicon (Si), zinc (Zn), tin (Sn), lead (Pb), nitrogen (N), oxygen (O), fluorine (F), niobium (Nb), lanthanum (La), cerium (Ce), neodymium (Nd), gadolinium (Gd), ytterbium (Yb), or a combination thereof.

In some embodiments, Fe may be included to strengthen the alloy composition. In some embodiments, Cr may be included to control the grain structure of the composition, prevent grain growth in the alloy and/or prevent recrystal-lization during a heat treatment in the alloy composition. In some embodiments, Cr may also reduce stress corrosion susceptibility and may improve toughness. In some embodiments, Zr may be included to the alloy composition to prevent recrystallization in the alloy composition. In some embodiments, Li may be included to the alloy composition may substantially increase strength and Young's modulus, may provide precipitation hardening and/or decrease density of the alloy composition.

In some embodiments, the at least one additional element is or includes Ni, wherein the Ni is included in an amount of about 0.2 wt % to about 1 wt %, based on total weight of the aluminum alloy composition. In some embodiments, Ni is included in an amount of about 0.2 wt %, about 0.3 wt %, about 0.4 wt %, about 0.5 wt %, about 0.6 wt %, about 0.7 wt %, about 0.8 wt %, about 0.9 wt %, or about 1 wt %, based on total weight of the aluminum alloy composition. In some embodiments, Ni may be included in the aluminum alloy composition to improve hardness and strength at high temperatures, and/or to reduce the coefficient of expansion.

In an embodiment, the aluminum alloy composition may further include at least one additional element, wherein the at least one additional element may include at least one of Fe, Cr, Ni, Ti, zirconium (Zr), lithium (Li), lead (Pb), bismuth (Bi), or a combination thereof. In some embodiments, Pb and Bi may be included to the aluminum alloy composition to aid in chip formation and improve machinability.

In some embodiments, the chamber component may include a chamber lid, a shower head, a nozzle, a substrate support assembly, an electrostatic chuck, a cathode, or a gas distribution plate.

In some embodiments, the first portion of the body of the chamber component includes a first layer of the chamber component having a thickness of about 30 μm to about 5 mm, and wherein the second portion of the chamber component includes a second layer of the chamber component having a thickness of about 5 nm to about 5 mm. In some embodiments, the second portion of the body is on top of the first portion of the body. In some embodiments, the surface of the chamber component is the surface of the second portion. In another embodiment, the oxidation layer may be on the second portion of the body. In some embodiments, the first portion may have a thickness of about 30 μm to about 5 mm, about 50 μm to about 4 mm, about 100 μm to about 3 mm, about 150 μm to about 2 mm, about 300 μm to about 1 mm, about 500 μm to about 900 μm, about 600 μm to about 800 μm, or about 650 μm to about 750 μm. In some embodiments, the second portion may have a thickness of about 0.5 nm to about 5 mm, about 5 nm to about 5 mm, about 10 nm to about 4 mm, about 50 nm to about 3 mm, about 100 nm to about 2 mm, or about 250 nm to about 1 mm, or any value or subrange herein.

In some embodiments, the oxidation layer of the chamber component has conformal oxidation for corrosion resistance. For example, the breakdown voltage of the oxidation layer may be about 500 V/mil to about 1000 V/mil, about 550 V/mil to about 950 V/mil, about 600 V/mil to about 900 V/mil, or about 650 V/mil to about 850. In some embodiments, the oxidation layer may have a surface roughness Ra of about less than about 50 μ-in, less than about 45 μ-in, less than about 40 μ-in, less than about 35 μ-in, less than about 32 μ-in, less than about 30 μ-in, or less than about 35 μ-in. In some embodiments, the surface roughness Ra may be about 10 μ-in to about 50 μ-in, about 15 μ-in to about 45 μ-in to about 20 μ-in to about 40 μ-in, or about 25 μ-in to about 35 μ-in. In some embodiments, the thickness of the oxida-tion layer may be greater than about 75 μm, greater than about 100 μm, greater than about 125 μm, or greater than about 150 μm. In some embodiments, the thickness of the oxidation layer may be about 75 μm to about 500 μm, about 100 μm to about 475 μm, about 125 μm to about 450 μm, about 150 μm to about 425 μm, about 200 μm to about 400 μm, or about 225 μm to about 350 μm.

In an embodiment, the first layer of the first portion may have a thickness of about 10 nm to about 5 mm. In some embodiments, the first aluminum alloy composition may have a thickness of about 10 nm to about 5 mm, about 50 nm to about 4 mm, about 100 nm to about 3 mm, about 150 nm to about 2 mm, about 200 nm to about 1 mm, about 250 nm to about 900 μm, about 300 nm to about 750 μm, about 350 nm to about 500 μm, about 400 nm to about 250 μm, about 500 nm to about 100 μm, or about 750 nm to about 30 μm, or any value or sub-range herein.

In some embodiments, the second layer of the second portion may have at thickness of about 0.5 nm to about 5 mm, about 5 nm to about 5 mm, about 10 nm to about 4 mm, about 50 nm to about 3 mm, about 100 nm to about 2 mm, or about 250 nm to about 1 mm, or any value or subrange herein.

In an embodiment, the first layer of the first portion may be printed using a three dimensional printer at a thickness of about 10 μm to about 5 mm, about 30 μm to about 5 mm, about 100 μm to about 4 mm, about 250 μm to about 3 mm, about 500 μm to about 2 mm, or about 750 μm to about 1 mm, or any value or sub-range herein. In some embodiments, the layer may be printed having a minimum thickness of about 30 μm. In an embodiment, the second layer of the second portion may be printed using a three dimensional printer at a thickness of about 5 nm to about 5 mm, about 50 nm to about 4 mm, about 100 nm to about 3 mm, about 250 nm to about 2 mm, or about 500 mm to about 1 mm, or any value or subrange herein.

In an embodiment, the one or more aluminum alloy compositions may further include a second aluminum alloy composition disposed beneath the first aluminum alloy composition. The first aluminum alloy composition may provide improved corrosion resistance on a surface of the chamber component as compared to the second aluminum alloy composition.

In an embodiment, a first section of the body of the chamber component may include a thinner layer of the first aluminum alloy composition, when compared to a second section of the body of the chamber component. In some embodiments, the first section of the body may include an outer section of the body of the chamber component. In some embodiments, the second section of the body of the chamber component may include an inner section of the body of the chamber component.

In another embodiment, a method is provided. The method includes printing a first portion of a chamber component for a process chamber using a three dimensional printer. The first portion of the chamber component includes a first aluminum alloy composition having a first grain size. The method further includes printing a second portion of the chamber component using the three dimensional printer. The second portion of the chamber component includes a second aluminum alloy composition having a second grain size, wherein the first grain size of the first aluminum alloy composition is greater than the second grain size of the second aluminum alloy composition. The inventors have found that when the grain size of the material is smaller near the surface of the chamber component and increases in size towards the bottom of the chamber component, then it has improved corrosion resistance.

In another embodiment, a first portion of the chamber component can be formed by casting the first aluminum alloy composition having a first grain size and then printing a second portion of the chamber component using the three dimensional printer. The second portion of the chamber component includes a second aluminum alloy composition having a second grain size, wherein the first grain size of the first aluminum composition is greater than the second grain size of the second aluminum alloy composition.

In some embodiments, the method may further include treating the chamber component. In an embodiment, the treating may occur after printing the first portion of the chamber component or after printing after the second portion of the chamber component. In an embodiment, the method may include a first treatment before printing of the second portion of the chamber component. In other embodiments, the method may further include a second treatment after printing of the chamber component. The first treatment/treating of the chamber component causes stress relief within the chamber component. The second treatment/treating may be a thermal treatment.

In some embodiments, the treating includes a thermal treatment, a high isostatic pressing treatment, or an annealing treatment. The thermal treatment may include applying heat in a nonvacuum environment. The heat may be applied by having a temperature in a range of about 350° C. to about 600° C. It was found that this temperature range removes the residual stress in the chamber component. In some embodiments, the thermal treatment may occur at a pressure of about 250 MPa to about 350 MPa, or about 225 MPa to about 325 MPa. In some embodiments, the thermal treatment may occur for up to about 60 hours, or about 1 hour to about 60 hours, about 5 hours to about 55 hours, about 10 hours to about 50 hours, about 15 hours to about 45 hours, about 20 hours to about 35 hours, or about 25 hours to about 30 hours. The high isostatic pressing (HIP) treatment may include applying high temperature and high pressure to the chamber component. In an embodiment, the HIP treatment may include applying a temperature in the range of about 350° C. to about 590° C., and may occur for a duration of about 0.5 hours to about 6 hours. The HIP treatment may further occur at a pressure of about 50 MPa to about 150 MPa, or about 75 MPa to about 125 MPa. The annealing treatment may include solution annealing at a temperature of about 450° C. to about 600° C., quenching, and then aging at a temperature of about 150° C. to about 200° C. The inventors have found that by treating the portion of the chamber component changes the microstructure of the aluminum alloy composition, i.e. the grain size. Thus, by applying a treatment as described herein to a portion of the chamber component may control the grain size of the aluminum alloy composition of the portion to achieve the target resistance.

In other embodiments, the treating may also include a sintering process, or cycling through a plurality of heating and cooling.

In other embodiments, the treating may include incorporating additional elements having different grain sizes depending on the portion of the chamber component. In an embodiment, the treating may include increasing the amount of Ti in the aluminum alloy composition, which was found to decrease the grain size of the composition. In another embodiment, boron carbon and titanium may be deposited near the surface of the chamber component to help improve corrosion resistance and improves speed in which magnesium is distributed throughout the alloy, effecting the material properties.

In some embodiments, the printing of the first portion of the chamber component may occur at a temperature of 450° C. to about 600° C., while the printing of the second portion of the chamber component may occur at a temperature of 300° C. to about 550° C. In an embodiment, the first portion of the chamber component and the second portion of the chamber may be cooled at a temperature of 150° C. to about 300° C. In some embodiments, the printing may have a laser energy density of about 10 to about 1000 J/mm³, a laser spot size of about 10 μm to about 200 mm in diameter, and/or scan speed of about 10 to about 5000 mm/s. In some embodiments, the laser energy density may be about 10 to about 1000 J/mm³, about 20 to about 950 J/mm³, about 50 to about 900 J/mm³, about 100 to about 850 J/mm³, about 150 to about 800 J/mm³, about 200 to about 750 J/mm³, about 250 to about 700 J/mm³, about 300 to about 650 J/mm³, about 350 to about 600 J/mm³, or about 400 to about 550 J/mm³. In some embodiments, the laser spot size may be about 10 μm to about 200 mm, about 20 μm to about 190 mm, about 30 μm to about 180 mm, about 40 μm to about 170 mm, about 50 μm to about 160 mm, about 60 μm to about 150 mm, about 70 μm to about 140 mm, about 80 μm to about 130 mm, about 80 μm to about 120 mm, or about 90 μm to about 110 mm. In some embodiments, the scan speed may be about 10 to about 5000 mm/s, about 50 to about 4900 mm/s, about 100 to about 4800 mm/s, about 150 to about 4700 mm/s, about 200 to about 4500 mm/s, about 500 to about 4200 mm/s, about 750 to about 4000 mm/s, about 1000 to about 3750 mm/s, about 1250 to about 3500 mm/s, about 1500 to about 3250 mm/s, about 1750 to about 3000 mm/s, or about 2000 to about 2750 mm/s.

In some embodiments, the method may further include printing an oxidation layer on the second portion of the chamber component. In some embodiments, the adhesion of the oxidation layer to the second portion may be greater when compared to traditional aluminum alloy compositions. In an embodiment, the oxidation layer may include aluminum and magnesium in combination with at least one of B, C, Ti, or a combination thereof.

The inventors have found that providing different options for changing the parameters of the printing process has different effects on the material properties of the aluminum alloy composition. It has also been found that different treatment options also effect the material properties of the aluminum alloy composition. Therefore, by varying either the parameters of the printing process, or the treatment process, or a combination of both, can effect the material property of the alloy composition, such as density, grain size, yield and tensile strength, and/or modulus of elasticity. In some embodiments, the printing process, treatment process, or combination of both may affect element and microstructure distribution of the aluminum alloy composition. That is, it was found that the grain size of the aluminum alloy composition effects other material properties of the composition. Additionally, by changing the parameters of the printing process, the inventors have found they can have a larger grain size on the bottom of the chamber component, while the grain size is smaller near the top of the surface of the chamber component.

In an embodiment, it was found that increasing the amount of Ti in the aluminum alloy composition would decrease the grain size of the aluminum alloy composition, as well as decreasing the grain boundary within the composition.

In another embodiment, the inventors have found that the cooling rate of the printing process may also effect the grain size of the aluminum alloy composition. That is, when receiving the aluminum alloy composition for printing, it is melted into a melt pool. The melt pool is then used for printing of a portion of the chamber component, where the portion can be cooled at a controlled rate of about 1 K/μs to about 40 K/μs, about 5 μs to about 35 μs, about 10 μs to about 30 μs, or about 15 μs to about 25 μs.

In some embodiments, the aluminum alloy composition may have a tensile strength of about 250 MPa to about 400 MPa and a yield strength of about 200 MPa to about 300 MPa. In some embodiments, the aluminum alloy composition may have a tensile strength of about 290 MPa, and a yield strength of 240 MPa. In other embodiments, the aluminum alloy composition may have a tensile strength of about 310 MPa to about 350 MPa, and a yield strength of about 250 MPa to about 300 MPa.

In some embodiments, the first aluminum alloy composition and the second aluminum alloy composition may include Al in an amount of about 85 wt % to about 99 wt % based on total weight of the composition, and Mg in an amount of about 1 wt % to about 5 wt %, based on total weight of the composition. The first and second aluminum alloy composition may further include at least one additional element including at least one of B, C, Ti, Ni, Mn, Cr, Fe, Si, Zn, Pb, N, O, F, La, Ce, Nd, Gd, Yb, or a combination thereof. In an embodiment, the at least one additional element of the first aluminum alloy composition and the second aluminum alloy composition includes Ti, where the amount of Ti in the first aluminum alloy composition is greater than the second aluminum alloy composition.

In an embodiment, the at least one additional element includes Ti, and when the amount of Ti increases in the aluminum alloy composition of the present disclosure, the grain size of the aluminum alloy composition decreases.

In some embodiments the method may further include preparing a powder. The powder may include a plurality of particles each including an alloy composition including Al and a plurality of chemical elements; and a coating on the plurality of particles. The coating may include at least one of a plurality of nanoparticles, or a sol-gel including at least one of B, C, Mg, Ti, Ni, Mn, Cr, Fe, Si, Zn, Sn, Pb, N, O, Zr, Nb, Li, Bi, F, Y, La, Sc, Ce, Nd, Gd, Yb, or a combination thereof.

In some embodiments, the plurality of nanoparticles may be attached to the plurality of particles through a static charge, a Van der Waals force, or a covalent bond. In an embodiment, the plurality of nanoparticles may include a metal, an alloy, an oxide, a metal oxide, a metal alloy, a nitride, a carbide, a fluoride, or a combination thereof.

In an embodiment, the plurality of nanoparticles may have a particle size of about 0.5 nm to about 400 nm. In some embodiments, the plurality of nanoparticles may have a particle size of about 0.5 nm, about 1 nm, about 5 nm, about 10 nm, about 20 nm, about 50 nm, about 80 nm, about 100 nm, about 120 nm, about 150 nm, about 180 nm, about 200 nm, about 220 nm, about 250 nm, about 280 nm, about 300 nm, about 320 nm, about 350 nm, about 380 nm, or about 400 nm, or any value or sub-range herein.

In some embodiments, the aluminum alloy composition may have a melting temperature of about 450° C. to about 700° C., about 475° C. to about 675° C., about 500° C. to about 650° C., or about 550° C. to about 600° C. or any value or sub-range herein.

In some embodiments, the powder may include agglomerates of the plurality of nanoparticles and the particles. In an embodiment, the plurality of nanoparticles may be approximately uniformly distributed on the plurality of particles.

In another embodiment, a method of producing a chamber component is provided. The method may include performing an atomic layer deposition process to form an oxidation layer on a surface of a substrate. Performing the atomic layer deposition process may include depositing at least one layer including aluminum oxide. The substrate includes an aluminum alloy composition including Al, Mg, Ti, and at least one of B, C, Ni, Mn Cr, Fe, Si, Zn, Sn, Pb, N, O, Zr, Li, Bi, F, Y, La, Sc, Ce, Nd, Gd, Yb, or a combination thereof. The aluminum alloy composition may have a grain size of about 1 μm to about 100 μm. The grain size may vary depending on the element distribution and microstructure of the aluminum alloy composition. In some embodiments, the oxidate layer may be formed using an oxide precursor in an atomic layer deposition process, or particles including an oxide shell may be grown using the ALD process.

The method may further include depositing an aluminum alloy composition having a first grain size on a surface of the chamber component, wherein the aluminum alloy composition includes Al in an amount of about 85 wt % to about 99 wt % and Mg in an amount of about 1 wt % to about 5 wt %, based on total weight of the first aluminum alloy composition. In some embodiments, the aluminum alloy composition may include Al in an amount of about 85 wt %, about 86 wt %, about 87 wt %, about 88 wt %, about 89 wt %, about 90 wt %, about 91 wt %, about 92 wt %, about 93 wt %, about 94 wt %, about 95 wt %, about 96 wt %, about 97 wt %, about 98 wt %, or about 99 wt %, based on total weight of the aluminum alloy composition; and Mg in an amount of about 1 wt %, about 1.5 wt %, about 2 wt %, about 2.5 wt %, about 3 wt %, about 3.5 wt %, about 4 wt %, about 4.5 wt %, or about 5 wt %, based on total weight of the aluminum alloy composition. In some embodiments, the aluminum alloy composition may include one or more additional chemical elements that form an equiaxed grain structure of an aluminum matrix of the alloy composition. The one or more additional chemical elements may include at least one of B, C, Ti, Zr, Sc, Y, or a combination thereof.

In some embodiments, the method may further include depositing an additional aluminum alloy composition having a second grain size beneath the aluminum alloy composition (e.g., depositing the different aluminum alloy composition before depositing the aluminum alloy composition over the different aluminum alloy composition). In embodiments the different aluminum alloy composition may be deposited first, followed by deposition of the aluminum alloy composition over the different aluminum alloy composition. The aluminum alloy composition provides improved corrosion resistance on the surface as compared to the second aluminum alloy composition.

In some embodiments, the first grain size of the aluminum alloy composition is smaller than that of the second grain size of the different aluminum alloy composition. That is, the material has a smaller grain size near the surface of the chamber composition.

In an embodiment, the aluminum alloy composition may include B. B may be included in an amount of about 0.1 wt % to about 3 wt %, based on total weight of the aluminum alloy composition. In some embodiments, B may be included in an amount of about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, about 1.2 wt %, about 1.4 wt %, about 1.6 wt %, about 1.8 wt %, about 2 wt %, about 2.2 wt %, about 2.4 w %, about 2.6 wt %, about 2.8 wt %, about 3 wt %, or any value or sub-range herein, based on total weight of the aluminum alloy composition.

In an embodiment, the aluminum alloy composition may include C. C may be included in an embodiment of about 0.05 wt % to about 1 wt %, based on total weight of the first aluminum alloy composition. In some embodiments, C may be included in an amount of about 0.05 wt %, about 0.08 wt %, about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, or any value or sub-range herein, based on total weight of the aluminum alloy composition.

In an embodiment, the aluminum alloy composition may include Ti. Ti may be included in an amount of about 1 wt % to about 5 wt %, based on total weight of the alloy composition. In some embodiments, Ti may be included in an amount of about 1 wt %, about 1.5 wt %, about 2 wt %, about 2.5 wt %, about 3 wt %, about 3.5 wt %, about 4 wt %, about 4.5 wt %, about 5 wt %, or any value or sub-range herein, based on total weight of the aluminum alloy composition.

In some embodiments, the aluminum alloy composition may further include at least one additional element including at least one of Ni, Mn, Cr, Fe, Si, Zn, Sn, Pb, N, O, F, Nb, La, Ce, Nd, Gd, Yb, or a combination thereof.

In some embodiments, the at least one additional element is Ni, wherein the Ni is included in an amount of about 0.2 wt % to about 1 wt %, based on total weight of the aluminum alloy composition. In some embodiments, Ni is included in an amount of about 0.2 wt %, about 0.3 wt %, about 0.4 wt %, about 0.5 wt %, about 0.6 wt %, about 0.7 wt %, about 0.8 wt %, about 0.9 wt %, or about 1 wt %, based on total weight of the aluminum alloy composition.

In another embodiment, the aluminum alloy composition may include at least one additional element include at least one of Fe, Cr, Ni, Ti, Zr, Li, Pb, Bi, or a combination thereof.

In some embodiments, the different aluminum alloy composition may include Al in an amount of about 85 wt % to about 99 wt % and Mg in an amount of about 1 wt % to about 5 wt %, based on total weight of the different aluminum alloy composition. In some embodiments, the different aluminum alloy composition may include Al in an amount of about 85 wt %, about 86 wt %, about 87 wt %, about 88 wt %, about 89 wt %, about 90 wt %, about 91 wt %, about 92 wt %, about 93 wt %, about 94 wt %, about 95 wt %, about 96 wt %, about 97 wt %, about 98 wt %, or about 99 wt %, based on total weight of the different aluminum alloy composition; and Mg in an amount of about 1 wt %, about 1.5 wt %, about 2 wt %, about 2.5 wt %, about 3 wt %, about 3.5 wt %, about 4 wt %, about 4.5 wt %, or about 5 wt %, based on total weight of the different aluminum alloy composition. In some embodiments, the different aluminum alloy composition includes at least one additional element, which may be different then the at least one additional element of the aluminum alloy composition.

In some embodiments, the method includes preparing a powder including a plurality of particles each including the aluminum alloy composition having a coating on the plurality of particles, wherein the coating may include at least one of a plurality of nanoparticles, or a sol-gel.

In some embodiments, the coating may further include at least one of B, C, Mg, Ti, Ni, Mn, Cr, Fe, Si, Zn, Sn, Pb, N, O, Zr, Nb, Li, Bi, F, Y, La, Sc, Ce, Nd, Gd, Yb, or a combination thereof.

In an embodiment, the plurality of nanoparticles may be attached to the plurality of particles through a static charge, a Van der Waals force, or a covalent bond. In an embodiment, the plurality of nanoparticles are approximately uniformly distributed on to the plurality of particles.

Some embodiments are described herein with reference to chamber components and other articles installed in plasma etchers for semiconductor manufacturing. It should be understood that the articles described herein may be other structures that are exposed to plasma. Articles discussed herein may be chamber components for processing chambers such as semiconductor processing chambers. For example, the articles may be chamber components for a plasma etcher, a plasma cleaner, a plasma sputter reactor, a plasma propulsion system, or other processing chambers. The processing chambers may be used for processes in which a corrosive plasma environment having plasma processing conditions is provided. For example, the processing chamber may be a chamber for a plasma etcher or plasma etch reactor, a plasma cleaner, a plasma sputter reactor, and so forth. Examples of chamber components include a substrate support assembly, an electrostatic chuck (ESC), a ring (e.g., a process kit ring or single ring), a chamber wall, a base, a gas distribution plate, a showerhead, an electrode, a nozzle, a liner, a liner kit, a shield, a plasma screen, a flow equalizer, a cooling base, a chamber viewport, a chamber lid, and so on.

In some embodiments, the articles described herein may be a ceramic article, a metal article, or a ceramic or a metal article. It should be understood that the articles discussed herein may also have improved corrosion resistance when used in process chambers for other processes such as non-plasma etchers, non-plasma cleaners, chemical vapor deposition (CVD) chambers, physical vapor deposition (PVD) chambers, plasma enhanced chemical vapor deposition (PECVD) chambers, plasma enhanced physical vapor deposition (PEPVD) chambers, plasma enhanced atomic layer deposition (PEALD) chambers, an atomic layer deposition (ALD) chamber, and so forth.

Referring now to the figures, FIG. 1 is a sectional view of a processing chamber 100 (e.g., a semiconductor processing chamber) having one or more chamber components in accordance with embodiments of the present disclosure. For example, one or more chamber components may be 3D printed parts that include one or more aluminum alloy compositions as described herein. For example, any of the described chamber components may have a first region or portion that is composed of a first aluminum alloy composition having first properties and a second region or portion that is composed of a second aluminum alloy composition having second properties. The processing chamber 100 may be used for processes in which a corrosive plasma environment and/or corrosive chemistry is provided. For example, the processing chamber 100 may be a chamber for a plasma etch reactor (also known as a plasma etcher), a plasma deposition chamber, and so on. Examples of chamber components that may be exposed to plasma in the processing chamber 100 are a substrate support assembly 148, an electrostatic chuck (ESC), a ring (e.g., a process kit ring or single ring), a chamber wall, a base, a showerhead 130, a gas distribution plate, a face plate, a liner, a liner kit, a shield, a plasma screen, a remote plasma source, a flow equalizer, a cooling base, a chamber viewport, a chamber lid, a ceramic insulator, a quartz insulator, a nozzle, process kit rings, and so on. In some embodiments, processing chamber 100 is used to perform an etch process on a patterned substrate that includes a plurality of trenches formed thereon. In other embodiments, processing chamber 100 may be used to in a deposition chamber.

In one embodiment, the processing chamber 100 includes a chamber body 102 and a showerhead 130 that enclose an interior volume 106. The showerhead 130 may or may not include a gas distribution plate. For example, the showerhead may be a multi-piece showerhead that includes a showerhead base and a showerhead gas distribution plate bonded to the showerhead base. Alternatively, the showerhead 130 may be replaced by a lid and a nozzle in some embodiments, or by multiple pie shaped showerhead compartments and plasma generation units in other embodiments. The chamber body 102 may be fabricated from nickel, copper, cobalt, chromium, molybdenum, aluminum, stainless steel, ruthenium, tungsten, platinum, or other suitable material. The chamber body 102 generally includes sidewalls 108 and a bottom 110. Any of the showerhead 130 (or lid and/or nozzle), sidewalls 108 and/or bottom 110 may include a multi-layer plasma resistant coating, or a single layer plasma resistant coating.

An outer liner 116 may be disposed adjacent the sidewalls 108 to protect the chamber body 102. The outer liner 116 may be a halogen-containing gas resist material such as $Al_2O_3$ or $Y_2O_3$. The outer liner 116 may be coated with the multi-layer plasma resistant ceramic coating in some embodiments.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewalls 108 of the chamber body 102 and/or on a top portion of the chamber body. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or carrier gases to the interior volume 106 through the showerhead 130 or lid and nozzle. Examples of process gas that may be delivered by the gas panel 158 and used to process substrates/samples in the processing chamber 100 include a silicon containing gas, halogen-containing gases, such as $C_2F_6$, $SF_6$, HBr, $NF_3$, $CF_4$, $CHF_3$, $CH_2F_2$, $F_2$, $NF_3$, $Cl_2$, $CCl_4$, $BCl_3$ and $SiF_4$, among others, and other gases such as $O_2$ or $N_2O$. Examples of carrier gases (also referred to herein as a diluent) include $N_2$, He, Ar, and other gases inert to process gases (e.g., non-reactive gases). The showerhead 130 includes multiple gas delivery holes 132 throughout the showerhead 130. The showerhead 130 may be or may include aluminum, anodized aluminum, an aluminum alloy, or an anodized aluminum alloy. In some embodiments, the showerhead 130 may include the aluminum alloy composition according to the present disclosure. In some embodiments, the showerhead 130 may further include an additional coating. In some embodiments, the showerhead includes a gas distribution plate (GDP) bonded to the showerhead. The GDP may be, for example, Si or SiC, or may be a ceramic such as $Y_2O_3$, $Al_2O_3$, $Y_3Al_5O_{12}$ (TAG), and so forth. The GDP may additionally include multiple holes that line up with the holes in the showerhead.

For processing chambers used for conductor etch (etching of conductive materials), a lid may be used rather than a showerhead. The lid may include a center nozzle that fits into a center hole of the lid. The lid may be a ceramic such as $Y_2O_3$, $Al_2O_3$, YAG or a ceramic compound comprising $Y_4Al_2O_9$ and a solid-solution of $Y_2O_3$—$ZrO_2$. The nozzle may also be a ceramic, such as $Y_2O_3$, $Al_2O_3$, YAG or a ceramic compound comprising $Y_4Al_2O_9$ and a solid-solution of $Y_2O_3$—$ZrO_2$.

A substrate support assembly 148 is disposed in the interior volume 106 of the processing chamber 100 below the showerhead 130. The substrate support assembly 148 holds a substrate 144 (e.g., a wafer) during processing. The substrate support assembly 148 may include an electrostatic chuck that secures the substrate 144 during processing, a metal cooling plate bonded to the electrostatic chuck, and/or one or more additional components. An inner liner may cover a periphery of the substrate support assembly 148. The inner liner may be a halogen-containing gas resist material such as $Al_2O_3$ or $Y_2O_3$. The substrate support assembly, portions of the substrate support assembly, and/or the inner liner may be coated with the metal layer and barrier layer in some embodiments.

In some embodiments, the article of the present disclosure may be a chamber component, such as a substrate support assembly, an electrostatic chuck (ESC), a ring (e.g. a process kit ring or single ring), a chamber wall, a base, a gas distribution plate or showerhead, a liner, a liner kit, a shield, a plasma screen, a flow equalizer, a cooling base, a chamber viewport, a chamber lid, a face plate, a surface mount device (SMD), and so on. The body of an article may be a metal, a ceramic, a metal-ceramic composite, a polymer or a polymer-ceramic composite. In an embodiment, the body of the article may be an aluminum alloy composition of the present disclosure.

When the surfaces of a chamber component are no longer smooth, i.e., have metal fluoride deposits or particles form on it, the chamber component cannot function at optimal capacity and needs to replaced. Thus, the methods of cleaning the surface of the present disclosure may be useful in various chamber components to remove the metal fluoride deposits or particles that form on a surface of a chamber component.

FIG. 2A illustrates one embodiment of a bottom view of a showerhead 200. The showerhead 200 may have a series of gas conduits 204 (also referred to as holes) arranged concentrically that evenly distribute plasma gasses directly over a substrate or wafer to be etched or processed. The showerhead 200 may alternatively have a series of gas conduits 204 arranged in different configurations, such as a spiral array. The showerhead is depicted here having approximately 1100 gas conduits 204 arranged in evenly distributed concentric rings for even distributing of gasses. In another embodiment, the gas conduits 204 may be configured in alternative geometric configurations on the lower surface 205 of the showerhead (or on a lower surface of a GDP bonded to a showerhead). For example, the showerhead may have a square or rectangular configuration having rows and columns of gas conduits 204. It is to be understood that other shapes (e.g., triangle, pentagon, etc.) may be implemented. The showerhead 200 can have many gas conduits 204, as depicted, or as few gas conduits as appropriate depending on the type of reactor and/or process utilized. In embodiments, the showerhead 200 is a 3D printed part.

In one embodiment, some or all gas conduits 204 do not include branches (e.g., each gas conduit may have a single entry point and a single exit point). Additionally, the gas conduits may have various lengths and orientation angles. Gas may be delivered to the gas conduits 204 via one or more gas delivery nozzles. Some gas conduits 204 may receive the gas before other gas conduits 204 (e.g., due to a proximity to a gas delivery nozzle). In some embodiments, one or more gas conduits 204 include branches, changing internal diameters, changes in direction, and/or other internal features that would be impractical to form via traditional manufacturing processes. In embodiments, the complex internal features of the showerhead 200 are achieved via 3D printing of the showerhead 200. The gas conduits 204 may be configured to deliver gas to a substrate resting beneath the showerhead at approximately the same time based on varying the orientation angles, diameters and/or lengths of the gas conduits 204, or by using an additional flow equalizer in embodiments. For example, gas conduits 204 that will receive gas first may be longer and/or have a greater angle (e.g., an angle that is further from 90 degrees) than conduits that will receive gas later.

FIG. 2B also illustrates a showerhead 220 being a single contiguous part. The shower head 220 includes a first aluminum alloy composition near the bottom of the showerhead 210, and a second aluminum alloy composition near the surface of the showerhead 215. The first aluminum alloy composition has a larger grain size when compared to the second aluminum alloy composition. This is because the second aluminum alloy composition is near the surface of the showerhead 220, it is more likely to be exposed to corrosive plasma. Thus, to improve corrosion resistance, the aluminum alloy composition near the surface has a smaller grain size then the aluminum alloy composition near the bottom of the showerhead 220. Thus, the showerhead 220 may be 3D printed such that the first aluminum alloy has a larger grain size, and the second aluminum alloy has a smaller grain size as described herein. In some embodiments, the second aluminum alloy composition has increased corrosion resistance as compared to the first aluminum alloy composition. The showerhead 220 may further include an oxidation layer (not pictured) on the second aluminum alloy composition. The oxidation layer may further include an aluminum oxide, boron carbide, or titanium to improve the corrosion resistance of the showerhead 220.

The first aluminum alloy composition used in the showerhead 200 or 220 includes Al in an amount of about 85 wt % to about 98 wt % and Mg in an amount of about 1 wt % to about 5 wt %, based on total weight of the first aluminum alloy composition. In some embodiments, the first aluminum alloy composition may include Al in an amount of about 85 wt %, about 86 wt %, about 87 wt %, about 88 wt %, about 89 wt %, about 90 wt %, about 91 wt %, about 92 wt %, about 93 wt %, about 94 wt %, about 95 wt %, about 96 wt %, about 97 wt %, about 98 wt %, or about 99 wt %, based on total weight of the first aluminum alloy composition; and Mg in an amount of about 1 wt %, about 1.5 wt %, about 2 wt %, about 2.5 wt %, about 3 wt %, about 3.5 wt %, about 4 wt %, about 4.5 wt %, or about 5 wt %, based on total weight of the first aluminum alloy composition. In some embodiments, the first aluminum alloy composition may have a first grain size. In some embodiments, the first aluminum alloy composition may include one or more additional chemical elements that form an equiaxed grain structure of an aluminum matrix of the alloy composition. In some embodiments, the one or more additional chemical elements may include at least one of B, C, Ti, Zr, Sc, Y, or a combination thereof. In some embodiments, the one or more additional chemical elements may include B, C, and Ti. In another embodiment, the one or more additional chemical elements may include Zr, Sc, Y, or a combination thereof.

In an embodiment, the first aluminum alloy composition may include B. B may be included in an amount of about 0.1 wt % to about 3 wt %, based on total weight of the first aluminum alloy composition. In some embodiments, B may be included in an amount of about 0.1 wt %, about 0.2 wt %,

17 about 0.3 wt %, about 0.4 wt %, about 0.5 wt %, about 0.6 wt %, about 0.7 wt %, about 0.8 wt %, about 0.9 wt %, about 1 wt %, about 1.2 wt %, about 1.4 wt %, about 1.6 wt %, about 1.8 wt %, about 2 wt %, about 2.2 wt %, about 2.4 w %, about 2.6 wt %, about 2.8 wt %, about 3 wt %, or any value or sub-range herein, based on total weight of the first aluminum alloy composition.

In an embodiment, the first aluminum alloy composition may include C. C may be included in an embodiment of about 0.05 wt % to about 1 wt %, based on total weight of the first aluminum alloy composition. In some embodiments, C may be included in an amount of about 0.05 wt %, about 0.08 wt %, about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, or any value or sub-range herein, based on total weight of the first aluminum alloy composition.

In an embodiment, the first aluminum alloy composition may include Ti. Ti may be included in an amount of about 1 wt % to about 5 wt %, based on total weight of the alloy composition. In some embodiments, Ti may be included in an amount of about 1 wt %, about 1.5 wt %, about 2 wt %, about 2.5 wt %, about 3 wt %, about 3.5 wt %, about 4 wt %, about 4.5 wt %, about 5 wt %, or any value or sub-range herein, based on total weight of the first aluminum alloy composition.

In another embodiment, the first aluminum alloy composition may include at least one additional element include at least one of Fe, Cr, Ni, Ti, Zr, Li, Pb, Bi, or a combination thereof.

In some embodiments, the at least one additional element is Ni, wherein the Ni is included in an amount of about 0.2 wt % to about 1 wt %, based on total weight of the first aluminum alloy composition. In some embodiments, Ni is included in an amount of about 0.2 wt %, about 0.3 wt %, about 0.4 wt %, about 0.5 wt %, about 0.6 wt %, about 0.7 wt %, about 0.8 wt %, about 0.9 wt %, or about 1 wt %, based on total weight of the first aluminum alloy composition.

In another embodiment, the first aluminum alloy composition may include at least one additional element include at least one of Fe, Cr, Ni, Ti, Zr, Li, Pb, Bi, or a combination thereof.

In an embodiment, a second aluminum alloy composition may be included in the showerhead 200. The second aluminum alloy composition may include Al in an amount of about 85 wt % to about 99 wt % and Mg in an amount of about 1 wt % to about 5 wt %, based on total weight of the second aluminum alloy composition. In some embodiments, the second aluminum alloy composition may include one or more additional chemical elements including at least one of B, C, Ti, Zr, Sc, Y, or a combination thereof. In some embodiments, the second aluminum alloy composition may have a second grain size.

In another embodiment, the second aluminum alloy composition may include at least one additional element include at least one of Fe, Cr, Ni, Ti, Zr, Li, Pb, Bi, or a combination thereof.

In some embodiments, the at least one additional element is Ni, wherein the Ni is included in an amount of about 0.2 wt % to about 1 wt %, based on total weight of the second aluminum alloy composition.

In another embodiment, the second aluminum alloy composition may include at least one additional element include at least one of Fe, Cr, Ni, Ti, Zr, Li, Pb, Bi, or a combination thereof.

In an embodiment, the second aluminum alloy composition may include different elements than the first aluminum alloy composition. In an embodiment, the second aluminum alloy composition may include the same elements as the first aluminum alloy composition. In an embodiment, the first grain size of the first aluminum alloy composition may be greater than the second grain size of the second aluminum alloy composition. In embodiments, the second aluminum alloy composition has a different microstructure than the first aluminum alloy composition. The different microstructures may include different grain sizes, different particle sizes, different compositions, different densities, and so on.

In some embodiments, the aluminum alloy composition may be deposited using a three-dimensional printing process. The three-dimensional printing-process may enable a conformal coating of relatively uniform thickness, on the surface 205. Uniform thickness refers to having a thickness variation of less than about +/−20%, a thickness variation of +/−10%, a thickness variation of +/−5%, or a lower thickness variation when comparing the thickness of the aluminum alloy composition at one location to its thickness at another location on the film or when assessing the standard deviation achieved from the average of a plurality of thickness values from a plurality of locations on the film.

While an example component of a showerhead is shown in FIG. 2A and 2B, it should be understood that the principles discussed with reference to the showerhead in FIG. 2A and 2B apply to any chamber components as well as other 3D printed parts. For example, other parts may have different regions composed of different aluminum alloy compositions, having different thicknesses, disposed at different locations, and so on.

In embodiments, the layers of the chamber component including a plurality of aluminum alloy compositions are described. The plurality of aluminum alloy compositions may include the first aluminum alloy composition and second aluminum alloy composition as described above, but are not limited to those. The specific elements and amounts of those elements in the aluminum alloy composition may be tailored for a particular application and/or for particular target properties.

Figure 3:
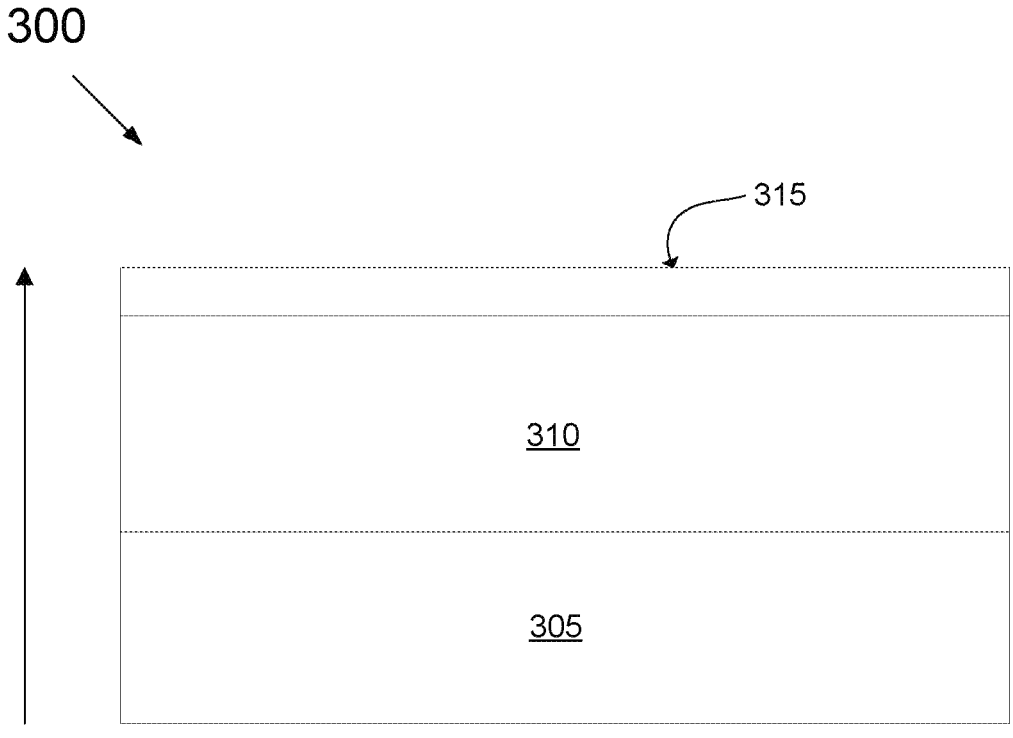
FIG. 3 depicts powder used to three dimensionally print chamber components comprising a tailored aluminum alloy, in accordance with embodiments of the present disclosure.

FIG. 3 depicts chamber component 300 that may be three dimensionally printed including a first aluminum alloy layer 305 and a second aluminum alloy layer 310. In embodiments, the first aluminum alloy layer includes a base aluminum alloy with controlled boundaries that have been tailored to achieve a tailored aluminum alloy composition. The tailored aluminum alloy composition may have a first grain size. The base aluminum alloy may include, for example, Al and Mg. In some embodiments, the base aluminum alloy includes Al in an amount of about 85 wt % to about 99 wt %. The base aluminum alloy may further include Mg in an amount of about 1 wt % to about 5 wt %. The base aluminum alloy may further include one or more additional chemical elements, wherein the one or more additional chemical elements may include at least one of boron (B), carbon (C), titanium (Ti), zirconium (Zr), scandium (Sc), yttrium (Y), or a combination thereof.

In some embodiments, the Al may be included in an amount of about 85 wt %, about 88 wt %, about 90 wt %, about 91 wt %, about 92 wt %, about 93 wt %, about 94 wt %, about 95 wt %, about 96 wt %, about 97 wt %, about 98 wt %, about 99 wt %, or any value or sub-range herein, based on total weight of the alloy composition.

In some embodiments, the Mg may be included in an amount of about 1 wt %, about 1.5 wt %, about 2 wt %, about 2.5 wt %, about 3 wt %, about 3.5 wt %, about 4 wt %, about 4.5 wt %, about 5 wt %, or any value or sub-range herein, based on total weight of the alloy composition. When including Mg in the alloy composition of the present disclosure, Mg has been found to modulate anodized film porosity and homogeneity of the alloy composition.

In embodiments, the base aluminum alloy may include at least one of B, C, Mg, Ti, Ni, Mn, Cr, Fc, Si, Zn, Sn, Pb, N, O, Zr, Nb, Li, Bi, F, La, Ce, Nd, Gd, Yb, or a combination thereof, to form a first aluminum alloy.

In an embodiment, the first aluminum alloy may include B. B may be included in an amount of about 0.1 wt % to about 3 wt %, based on total weight of the first aluminum alloy. In some embodiments, B may be included in an amount of about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, about 1.2 wt %, about 1.4 wt %, about 1.6 wt %, about 1.8 wt %, about 2 wt %, about 2.2 wt %, about 2.4 w %, about 2.6 wt %, about 2.8 wt %, about 3 wt %, or any value or sub-range herein, based on total weight of the first aluminum alloy.

In an embodiment, the first aluminum alloy may include C. C may be included in an embodiment of about 0.05 wt % to about 1 wt %, based on total weight of the first aluminum alloy. In some embodiments, C may be included in an amount of about 0.05 wt %, about 0.08 wt %, about 0.1 wt %, about 0.2 wt %, about 0.3 wt %, about 0.4 wt %, about 0.5 wt %, about 0.6 wt %, about 0.7 wt %, about 0.8 wt %, about 0.9 wt %, about 1 wt %, or any value or sub-range herein, based on total weight of the first aluminum alloy.

In an embodiment, the first aluminum alloy may include Ti. Ti may be included in an amount of about 1 wt % to about 5 wt %, based on total weight of the first aluminum alloy. In some embodiments, Ti may be included in an amount of about 1 wt %, about 1.5 wt %, about 2 wt %, about 2.5 wt %, about 3 wt %, about 3.5 wt %, about 4 wt %, about 4.5 wt %, about 5 wt %, or any value or sub-range herein, based on total weight of the first aluminum alloy.

In another embodiment, the first aluminum alloy may include at least one additional element include at least one of Fe, Cr, Ni, Ti, Zr, Li, Pb, Bi, or a combination thereof.

In some embodiments, the first aluminum alloy may include a plurality of particles to form a powder that may be used as a powder source for 3D printing in some embodiments. During 3D printing, the powder may fuse together to form a tailored aluminum alloy composition. In embodiments, the amount of elements may be varied to arrive at a target grain size of the first aluminum alloy composition. In embodiments, the grain size of the first aluminum alloy layer 305 is larger (e.g., 10-1000 times larger, 20-700 times larger, 50-400 times larger, 100 times larger, etc.) than that of the second aluminum alloy layer 310.

In some embodiments, nanopowders are selected to form a eutectic system with the base particles of the tailored aluminum alloy composition. In an eutectic system, a mixture of substances (often metals) can melt at a lower temperature than any of its constituents. This phenomenon is explained by phase diagrams, which plot the phase (solid, liquid, or gas) of a substance or mixture of substances as a function of temperature and pressure. For some mixtures, there is a specific composition that has a lower melting point than any other composition, including those of the pure constituents. This point is known as the eutectic point, and the composition is the eutectic composition. A eutectic mixture melts as a whole at a single temperature, just like a pure substance. Its melting temperature is the eutectic temperature, and it is lower than the melting temperature of any of the constituents.

In embodiments, nanoparticles or sol-gel components form grain boundaries after the 3D printing process.

In an embodiment, the second aluminum alloy layer 310 is printed on top of the first aluminum alloy layer 305. The second aluminum alloy layer 310 includes a base aluminum alloy with controlled boundaries that have been tailored to achieve a tailored aluminum alloy composition. The tailored aluminum alloy composition may have a second grain size, which is smaller than the first grain size. In an embodiment, the grain size of the aluminum alloy is larger on the bottom layer, i.e. the first aluminum alloy layer 305, and decreases as it goes towards the surface of the chamber component as indicated in the directional arrow of FIG. 3. In an embodiment, to tailor the grain size of the aluminum layer, the second aluminum alloy composition in the second aluminum alloy layer 310 includes a greater amount of Ti when compared to the first aluminum alloy composition. In another embodiment, the grain size of the aluminum alloy composition may be tailored by treating the layer 310 with a thermal treatment, a HIP treatment or by annealing after printing the layer as described herein.

The chamber component 300 further includes an oxidation layer 315 that is printed using a 3D printer. The oxidation layer 315 is on top of the second aluminum alloy layer 310, where the oxidation layer 315 is exposed to the corrosive plasma during a plasma treatment. The oxidation layer may include aluminum and magnesium in combination with at least one of B, C, Ti, or a combination thereof. In an embodiment, the oxidation layer may include B and C, for example, boron carbide. In an embodiment, the oxidation layer may include Ti.

In another embodiment, the oxidation layer 315 may be formed by performing an atomic layer deposition process. The atomic layer deposition process includes depositing an aluminum oxide layer on the second aluminum alloy layer 310. The oxidation layer has been found to provide conformal corrosion resistance on the chamber component 300.

FIG. 4 is a flow chart representing a method 400 for preparing a three-dimensional printed chamber component. In the method 400, at block 402 a first powder having a first composition may be prepared. The first powder may include agglomerates of a base aluminum alloy particle and one or more surrounding nanoparticles. The first powder may be prepared based on the description as described in relation to FIG. 3.

At block 405, printing one or more first layers and/or portions or regions of a chamber component for a process chamber is performed using a three dimensional printer The chamber component may be a chamber lid, a showerhead, a nozzle, a substrate support assembly, an electrostatic chuck, a coupon, or a gas distribution plate.

Various techniques of 3D printing may be used in embodiments. In one embodiment, Selective Laser Melting (SLM) is used to 3D print the chamber component using the first powder. In an embodiment, the SLM may be a laser-powder bed fusion device, such as L-P9F. In SLM, a high-power laser selectively melts a layer of metal powder according to a digital 3D model. After each layer is melted, a build platform on which the component is printed is lowered, and a new layer of powder is spread over the surface and melted. The process is repeated until the part is completed. SLM can produce parts with complex geometries that would be difficult or impossible to create using traditional manufacturing methods.

In one embodiment, the SLM process includes creating a 3D digital model using computer-aided design (CAD) software. This model is then converted into a series of thin layers using slicing software. The slicing software generates a path that the laser will follow during the fabrication process.

The first powder (or first material) is selected based on the target properties of a first region of the final object. The target property may be, but is not limited to, a first grain size. The powder is placed in a 3D printer's reservoir, and a build platform is prepared. A thin layer of metal powder is spread over the build platform using a re-coater blade, roller or other device. The thickness of the layer is usually in the range of 20 to 80 micrometers, but it can vary depending on the specific machine and material.

The high-power laser scans the powder bed and selectively melts the powder according to the path generated by the slicing software. The energy from the laser is intense enough to fully melt the metal powder, causing it to solidify as a fully dense material.

Once a layer is complete, the build platform is lowered, and a new layer of powder is spread across the surface. The laser then melts the new layer, binding it to the layer below. This process is repeated, layer by layer, until the entire part is built.

Once the printing is complete, the build platform is allowed to cool. The finished part is then removed from the powder bed, often with the help of a brush or air blower. Unmelted powder is recycled for use in future builds. The part may also undergo additional post-processing steps, such as heat treatment to relieve stresses, or machining to achieve a desired surface finish or dimensional accuracy.

In some embodiments, direct metal laser sintering (DMLS) is performed to 3D print the chamber component. DMLS is similar to SLM, but instead of fully melting the metal powder, a laser heats the powder to just below its melting point, causing the particles to bond together at a molecular level. This method is typically used for metals with high melting points or alloys with different melting points.

In some embodiments, electron beam melting (EBM) is performed to 3D print the chamber component. EBM is similar to SLM but uses a focused beam of electrons instead of a laser to melt the metal powder. The EBM process takes place in a vacuum, which prevents oxidation of reactive metals like titanium.

In some embodiments, binder jetting is performed to 3D print the chamber component. In binder jetting, a binding agent is selectively deposited onto the metal powder, sticking the particles together and building the part layer by layer. After printing, the part is cured in an oven to burn off the binder and fuse the metal particles together. This method can produce parts with complex geometries and is often faster than other methods.

In some embodiments, metal fused filament fabrication (FFF) is performed to 3D print the chamber component. In this process, a filament made of metal powder mixed with a binder is extruded through a heated nozzle. After printing, the part is sintered in an oven to burn off the binder and fuse the metal particles together.

In some embodiments, directed energy deposition (DED) is performed to 3D print the chamber component. In DED, a focused energy source (like a laser or electron beam) is used to melt metal powder or wire as it's being deposited. This method is typically used for adding material to existing parts or for repair applications. In some embodiments DED or another 3D printing technique may be performed to add one or more layers of a metal alloy to an already manufactured part (e.g., to a used part). Accordingly, in embodiments 3D printing may be performed to repair a used chamber component by adding one or more layers of an aluminum alloy having tailored properties to an already manufactured chamber component.

The one or more first layers and/or portions of the chamber component may include a first aluminum alloy composition. The first aluminum alloy composition may be a composition as described above, for example the first aluminum alloy composition may correspond to that of FIG. 3. In one embodiment, the first aluminum alloy composition is deposited to form a target thickness layer at a surface of a chamber component.

After printing the first portion of the body, the first portion may be treated in block 406. The treating may include sintering the first portion at a temperature of 400° C. The treating may also include applying a plurality of heating and cooling cycles. In some embodiments, the first portion may be heated at a temperature between 400° C. and 540° C. for about 1 hour to about 18 hours, and may be cooled down to a temperature of about 150° C. to about 250° C. The treatment may cause stress relief in the aluminum alloy composition.

After and/or during printing one or more first layers and/or regions of a chamber component in block 405, one or more second layers and/or portions may be printed in block 410. In some embodiments, prior to printing the one or more second portions, a second powder having a second composition may be prepared at block 408. Alternatively, the first powder may be used to print the second portion. The second powder may be prepared, for example, as described above in relation to FIG. 3. For example, the second powder may include agglomerates of a base aluminum alloy particle and one or more surrounding nanoparticles.

The one or more second layers and/or regions may be printed using the three dimensional printer. The one or more second layers and/or regions may include a second aluminum alloy composition that is different from the first aluminum alloy composition. In another embodiment, the second aluminum alloy composition may be the same as the first aluminum alloy composition. In an embodiment, the second aluminum alloy composition may include more Ti when compared to the first aluminum alloy composition. Thus, when the second portion is printed, the second aluminum alloy composition will have a smaller grain size when compared to the first aluminum alloy composition. The second aluminum alloy composition may provide improved corrosion resistance on the surface as compared to the first aluminum alloy composition in some embodiments. The second aluminum alloy composition may be a composition as described above, for example the first aluminum alloy composition may correspond to that of FIGS. 2A-B. In one embodiment, the second aluminum alloy composition is deposited to form a second target thickness layer at a surface of the chamber component.

After printing one or more second layers and/or regions of a chamber component in block 410, the body of the chamber component may be treated to obtain target mechanical properties of the aluminum alloy composition in block 415. The treatment may include a thermal treatment, a hot isostatic pressing (HIP) treatment and/or annealing treatment as described within. In an embodiment, the treatment produces an aluminum alloy composition having target mechanical properties, including but not limited to, grain size and/or grain boundary, tensile strength and/or yield strength.

After treating the body of the chamber component in block 410, one or more oxidation layers and/or portions may be formed in block 420. In some embodiments, the one or more oxidation layers and/or regions may be printed using the three dimensional printer. The oxidation layer may include Al and Mg in combination with B, C, Ti, or a combination thereof. In some embodiments, the oxidation layer may include Al and Mg in combination with B and C. In another embodiment, the oxidation layer may include Al and Mg in combination with Ti. In yet another embodiment, the oxidation layer may include an aluminum oxide layer that is added by performing an atomic layer deposition process. In some embodiments, the oxidation layer is formed by performing anodization of exposed surfaces of the first portion and/or the second portion of the body. In some embodiments, the oxidation layer is formed via a deposition process, such as atomic layer deposition (ALD), physical vapor deposition (PVD), ion assisted deposition (IAD), plasma spray, chemical vapor deposition (CVD), and/or another deposition process.

In some embodiments, a layer of the chamber component formed according to method 400 is composed of a single aluminum alloy composition. In some embodiments, one or more layers of the chamber component formed according to method 400 are composed of multiple different aluminum alloy compositions. For example, a first region of an area may be printed using a first powder and have a first aluminum alloy composition and a second region of the area may be printed using a second powder and have a second aluminum alloy composition. In some embodiments, different nozzles are used to deposit the different powders either one at a time or concurrently. A 3D printer may, for example, include multiple reservoirs each of which includes a different powder formulation. The 3D printer may include a different nozzle connected to the respective reservoirs or a single nozzle that connects to both reservoirs. In such an embodiment, the 3D printer may control which reservoir the nozzle is drawing powder from at any given time. If multiple nozzles are used to deposit powder, then in some embodiments both nozzles may be used to deliver powder at a same time.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an34nclusivee "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A chamber component comprising:
   a body comprising a plurality of aluminum alloy compositions;
   wherein a first portion of the body comprises a first aluminum alloy composition having a first grain size;
   wherein a second portion of the body comprises a second aluminum alloy composition having a second grain size; and
   wherein the first grain size of the first aluminum alloy composition is greater than the second grain size of the second aluminum alloy composition,
   wherein a surface of the chamber component comprises an oxidation layer, wherein the oxidation layer comprises aluminum and magnesium in combination with at least one of boron (B), carbon (C), titanium (Ti), or a combination thereof.

2. The chamber component of claim 1, wherein the oxidation layer is on the second portion of the body.

3. The chamber component of claim 1, wherein the oxidation layer comprises aluminum, magnesium, boron and carbon.

4. The chamber component of claim 1, wherein the oxidation layer comprises aluminum, magnesium, and titanium.

5. The chamber component of claim 1, wherein the oxidation layer is magnesium rich including about 0.5 wt % to about 5 wt %, based on total weight of the oxidation layer.

6. The chamber component of claim 1, wherein the first portion of the body comprises a first layer of the chamber component having a thickness of about 10 μm to about 5 mm, and the second portion of the body comprises a second layer of the chamber component.

7. The chamber component of claim 6, wherein the second layer has a thickness of about 5 nm to about 5 mm.

8. The chamber component of claim 1, wherein the second portion of the body is on top of the first portion of the body.

9. The chamber component of claim 1, wherein the first grain size is in a range of about 1 μm to about 100 μm and the second grain size is in a range of about 0.5 nm to about 20 μm.

10. The chamber component of claim 1, wherein the second portion has conformal oxidation for corrosion resistance.

11. A method comprising:
    printing a first portion of a chamber component for a process chamber using a three dimensional printer, wherein the first portion of the chamber component comprises a first aluminum alloy composition having a first grain size of about 1 μm to about 100 μm;
    printing a second portion of the chamber component using the three dimensional printer, wherein the second portion of the chamber comprises a second aluminum alloy composition having a second grain size of about 0.5 nm to about 20 μm, wherein the first grain size of the first aluminum alloy composition is greater than the second grain size of the second aluminum alloy composition; and printing an oxidation layer on the second portion of the chamber component, wherein the oxidation layer comprises aluminum and magnesium in combination with at least one of boron (B), carbon (C), titanium (Ti), or a combination thereof.

12. The method of claim 11, further comprising treating the chamber component.

13. The method of claim 12, wherein the treating occurs after printing the second portion.

14. The method of claim 12, wherein the treating comprises a thermal treatment, a high isosteric pressing treatment, or an annealing treatment.

15. The method of claim 11, wherein the oxidation layer has higher bonding energy to the first portion of the chamber component.

16. The method of claim 11, comprising preparing a powder comprising a plurality of particles and a coating on the plurality of particles, wherein the coating comprises at least one of nanoparticles or a sol-gel, wherein the powder is used to print the one or more first layers of the chamber component.

* * * * *